May 18, 1965 C. A. WILKINS 3,184,687

PUSH-PULL POWER AMPLIFIER

Filed July 15, 1960

CHARLES A. WILKINS
INVENTOR.

BY Nathan N. Kallman

ATTORNEY

United States Patent Office 3,184,687
Patented May 18, 1965

3,184,687

PUSH-PULL POWER AMPLIFIER

Charles A. Wilkins, Mountain View, Calif., assignor to Ampex Corporation, Redwood City, Calif., a corporation of California Filed July 15, 1960, Ser. No. 43,091
3 Claims. (Cl. 330—70)

This invention relates to amplifiers, and particularly to an improved push-pull audio amplifier which utilizes negative and positive feedback.

Push-pull amplifiers are generally employed as balanced amplifiers to provide a minimum of distortion resulting from the generation of even-order harmonics. One type of push-pull amplifier, known as a single-ended push-pull amplifier, is described in the Journal of the Audio Engineering Society, October 1958, pages 244–250, by Miranda and Van Zelst.

In one form, a single-ended push-pull amplifier may comprise a pair of amplifying devices coupled so that an input signal is applied to one of the devices which, in turn, supplies a signal representative of the input signal to a second amplifying device. However, it is known that variations in a load impedance coupled to the output terminals of such amplifier tends to unbalance push-pull operation. It is also known that a low source impedance for an amplifier circuit affords improved regulation of the amplifier output.

Negative feedback, which is commonly used to minimize distortion appearing in the output circuit of a push-pull amplifier, tends to reduce the source resistance of an amplifier circuit. However, the use of negative feedback also reduces the overall gain of the amplifier thus usually requiring additional amplification to compensate for the loss of gain. To effect the necessary amplification, additional tubes are utilized which add to the cost and maintenance of the equipment and reduce its reliability.

An object of this invention is to provide an improved push-pull power amplifier.

Another object of this invention is to provide a push-pull power amplifier employing a plurality of feedback loops with no appreciable loss of gain or power output.

A further object is to provide a push-pull circuit having a low source resistance and improved output regulation.

According to this invention, a push-pull amplifier circuit comprising a pair of amplifiers connected in single-ended push-pull arrangement incorporates composite feedback circuits to provide balanced push-pull operation and low distortion without an appreciable decrease in gain. In the single-ended push-pull amplifier, an input signal is applied to a first amplifier, and the output signal of the first amplifier, in turn, is applied to a second amplifier. The composite feedback circuits apply negative feedback signal proportional to load voltage from a load impedance to the first amplifier and a positive feedback signal proportional to load current from the load impedance to the first amplifier. The composite feedback signal which includes the positive and negative feedback signals provides balanced operation by maintaining substantially equal direct current bias at each amplifier even with different values of load impedance. The circuit provides improved power output capability, enhanced gain, and substantial elimination of harmonic distortion in the output signal.

The invention will be described in greater detail with reference to the drawing, in which.

Figures 1, 2:
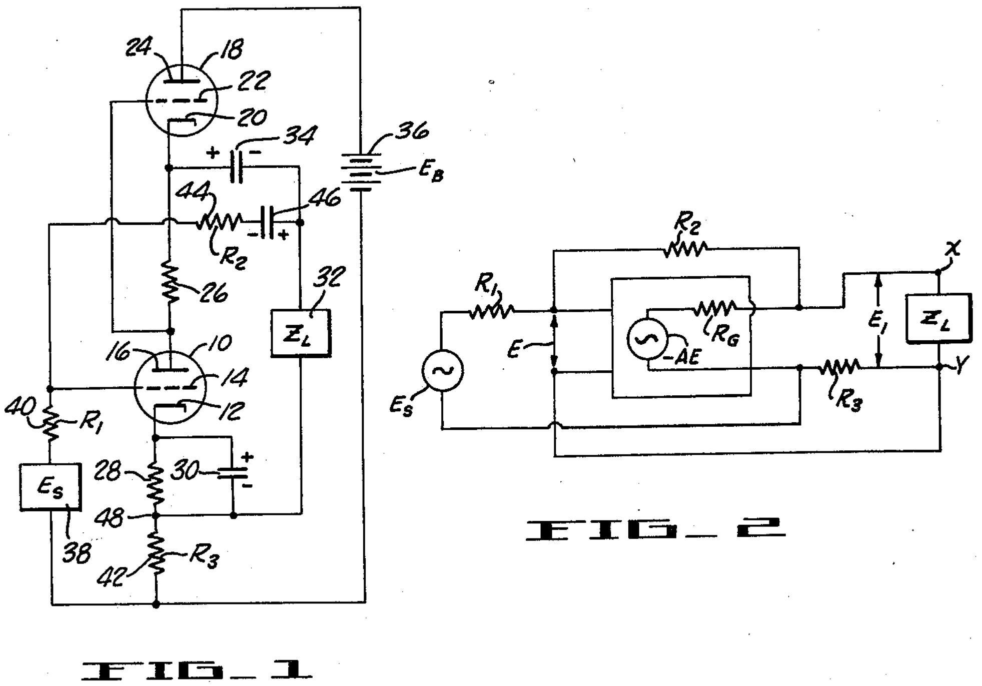
FIGURE 1 is a schematic circuit diagram showing a single-ended push-pull amplifier circuit according to the invention.
FIGURE 2 is an equivalent circuit diagram representing the effects of negative and positive feedback in the inventive circuit of FIGURE 1.

A single-ended push-pull amplifier in accordance with one embodiment of the invention shown in FIGURE 1 comprises a first triode 10 having a cathode 12, a control grid 14 and an anode 16. A second triode 18 having a cathode 20, a control grid 22 and an anode 24 is connected in direct current series with triode 10. A biasing resistor 26 is connected in the cathode circuit of the second triode 18 between anode 16 and cathode 20. In the cathode circuit of triode 10, a cathode bias resistor 28 shunted by a bypass capacitor 30 is provided. Capacitor 30 eliminates undesirable negative current feedback to cathode 12. A utilization load or load impedance 32, which may comprise the primary winding of a transformed having a voice coil of a loudspeaker coupled across its secondary winding for example, is connected across the cathode circuits of triodes 10 and 18. A direct current blocking capacitor 34 is coupled between cathode 20 and load impedance 32 and also serves as a coupling capacitor. A power supply, such as a battery 36, supplies bias voltages and anode voltages to triodes 10 and 18. One-half of the battery voltage appears between anode 16 of triode 10 and the negative terminal of battery 36 during the quiescent state.

In operation, an input signal is applied from a signal source 38 through a resistor 40 to the control grid 14 of triode 10. As the input signal goes positive, triode 10 becomes more conductive thus driving cathode 20 more negative causing triode 18 to be less conductive. Conversely, as input signal 38 goes negative, triode 10 conducts less thereby resulting in increased conductivity of triode 18. Thus it is seen that the dynamic impedance of the second triode 18 is directly related to the variation in impedance of the first triode 10.

In order to achieve balanced push-pull operation which results both in the cancellation of even-order harmonics and the improvement of maximum power output capability, the signal voltage developed between control grid 22 and cathode 20 of triode 18 should be equal to the signal voltage which appears between control grid 14 and cathode 12 of triode 10. Furthermore, it is usually necessary that cathode bias resistances for cathodes 12 and 20 should be equal because the operating points of triodes 10 and 18 are established by the direct current voltages developed across the respective resistors, hence by the values of these resistances. In the circuit shown in FIGURE 1, the bias resistance for cathode 12 comprises resistors 28 and 42, the additive resistance being substantially equal to bias resistor 26 for cathode 22. It is noted that other means of providing equal bias voltages to the grid-cathode circuits of each of the tubes may be employed.

In the single-ended push-pull amplifier circuits of the prior art, whenever the load impedance is varied, a condition of unbalance results between the amplifying tubes coupled in push-pull arrangement. For example, if the value of the load impedance should be decreased, the signal voltage drop across bias resistor 26 is increased, and the conductivity of triode 18 is increased accordingly. On the other hand, if the value of the load impedance is increased, the conductivity of triode 18 is reduced. However, the amplifier circuit of this invention employes positive feedback to compensate for the change in balance which occurs between the push-pull amplifying tubes whenever the load impedance is varied. Furthermore such positive feedback enhances the gain of the amplifier.

In accordance with the invention, a single-ended push-pull amplifier incorporates a load voltage-proportional negative feedback loop coupled between load impedance 32 and control grid 14. The negative feedback loop includes feedback resistors 44 and 40, and a blocking capacitor 46 which prevents direct current from appearing at control grid 14 thereby maintaining the direct current bias condition of triode 10. As is well known, the negative feedback signal applied to control grid 14 out of phase with the input signal reduces total harmonic distortion in the same proportion that it reduces the voltage amplification.

In addition to the negative feedback loop, the circuit of this invention provides a load current-proportional positive feedback loop that includes a feedback resistor 42. The load impedance 32 is coupled to a junction terminal 48 disposed between resistors 28 and 42. Resistor 42 serves to feed back a portion of the output signal appearing at the load impedance 32 in phase with the input signal applied to control grid 14, and also serves to develop a portion of the cathode bias for triode 10. Thus the positive feedback signal provides for a substantial increase in voltage amplification of the push-pull amplifier without employing additional amplifying devices. A feature of the positive load current-proportional feedback loop is that when the load impedance varies, the circuit automatically compensates for such variations so that the push-pull tubes maintain a balanced operation.

Both positive and negative feedback signals provide a reduction in source resistance, which may be made zero or even negative in value if desired. Such reduction in source resistance results in an improved regulation of output signal voltage. Furthermore, when employing a transformer in the utilization load, as the source resistance is reduced, the low frequency response is improved. Alternatively, the size and cost of a transformer may be reduced when utilizing a lower source resistance without affecting the frequency response.

In order to obtain optimum power transfer in such amplifier circuits wherein triodes are utilized as output tubes, the impedance which is reflected by utilization load 32 to the circuit should be equal to the inherent impedance (i.e., the impedance appearing in the absence of feedback) of the signal generator that comprises triodes 10 and 18 in this instance. In the equivalent circuit shown in FIGURE 2, the two feedback loops may be analyzed by equating the triodes 10 and 18 to a generator having a given generator resistance and gain, with the feedbacks external to the generator. The following mathematical development will aid in representing the effects of the circuit feedback:

Assume that $$\frac{R_1}{R_1+R_2}=\beta$$

where $\beta$ is equal to the fraction of output voltage that is fed back to the input, and that $$R_1+R_2>>Z_L$$

where $Z_L$ is the load impedance. If the load impedance $Z_L$ were removed and a current generator were substituted therefor between the terminals X and Y, and if the input signal source $E_s$ were removed and the terminals across which $E_s$ was connected were shorted, then the voltage developed across the current generator would be:

$$E_1=IR_g-AE+IR_3 \tag{1}$$

where $R_g$ is the generator resistance, A is the amplification of the stage, and E is the voltage supplied to the input terminals.

An analysis of the signal voltage distribution in the circuit shows that the voltage E which is applied to the input terminals is $$E=(IR_g-AE+IR_3)\beta+IR_3(1-\beta) \tag{2}$$

By solving for E in Equation 2 and substituting in Equation 1, the general equation which defines the output source resistance for the system is obtained.

$$R_s=\frac{E_1}{1}=R_g+R_3-\frac{RGA\beta}{1+A\beta}-\frac{AR_3}{1+A\beta} \tag{3}$$

The third term $$\frac{R_gA\beta}{1+A\beta}$$

represents the application of negative load voltage-proportional feedback which operates to reduce the source resistance as is indicated by the polarity of the term, and the fourth term $$\frac{AR_3}{1+A\beta}$$

represents the application of positive load current-proportional feedback which also acts to reduce the source resistance as is indicated by the polarity of the term.

Since it is desired that the operation of the circuit is such that the output source resistance $R_s$ is zero, then Equation 3 becomes $$R_3=RG/A-(1+A\beta) \tag{4}$$

To determine the value of $R_3$, which represents feedback resistor 42 in the circuit of FIGURE 2, the amplification and feedback values necessary to establish the desired gain are substituted for A and $\beta$. Since $R_g$ represents the inherent generator resistance that is determined by the operating characteristics of the amplifying devices employed before application of feedback, the resistance value for $R_3$ (resistor 42) may be derived.

To aid in analyzing the gain, the well known relationship defining the voltage amplification of a feedback amplifier is shown to be $$A'=A/(1-A\lambda) \tag{5}$$

where $\lambda$ is the fraction of the signal voltage at the output of the amplifier that is fed back to the input. The voltage distribution around the output loop is expressed as $$AE=I(R_g+Z_L+R_3) \tag{6}$$

The voltage $E_1$ which is applied to the input of the amplifier is the sum of signal voltage $E_s$ and feedback voltage $E_{fb}$.

The feedback voltage may be defined by two simultaneous equations as follows:

$$E_{fb}=-1Z_L\beta+1R_3(1-\beta) \tag{7}$$

and $$E_{fb}=\lambda(AE-1R_g) \tag{8}$$

By combining Equations 6, 7 and 8 and solving for $\lambda$, we derive:

$$\lambda=\frac{R_3(1-\beta)}{R_3+Z_L}-\frac{Z_L\beta}{Z_L+R_3} \tag{9}$$

The value of $\lambda$ shown by Equation 9 may be substituted in the general gain Equation 5 to determine the gain A of the amplifier.

The other condition of operation that should be provided is that the net feedback should not be positive in polarity. Therefore from Equation 9 it is noted that $$\frac{Z_L\beta}{Z_L+R_3}\geq\frac{R_3(1-\beta)}{R_3+Z_L} \tag{10}$$

If the second term of Equation 10 which represents the positive feedback is larger than the first term which represents the negative feedback, then a greater value for $\beta$ should be chosen. Accordingly the value of negative feedback resistor $R_1$ (resistor 40) should be increased. Alternately, the value of negative feedback resistor $R_2$ (resistor 44) may be decreased.

Figure 3:
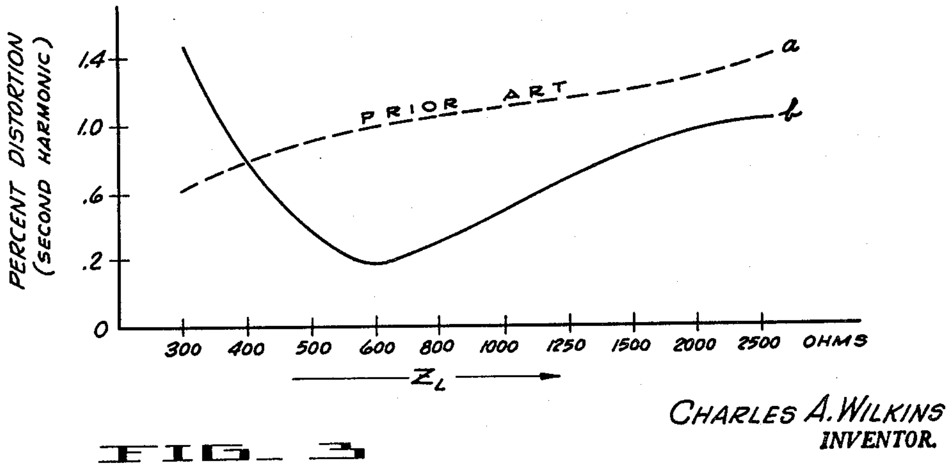
FIGURES 3*a* and 3*b* illustrate the distortion characteristics for various load impedances when using a prior art push-pull amplifier circuit and the amplifier circuit of the invention respectively.

FIGURE 3 illustrates the change in the distortion characteristic when positive and negative feedback loops are incorporated into a single-ended push-pull amplifier circuit. FIGURE 3*a* shows the percentage distortion at a constant power output appearing in a prior art single-ended push-pull amplifier circuit without feedback as the load impedance is varied whereas FIGURE 3*b* shows the marked reduction in distortion when employing the inventive circuit of FIGURE 1 at the same power output level when it is subjected to the same load impedance variation. In order that this data should constitute a valid comparison, the two circuits were made equivalent in all particulars excepting that the inventive principles disclosed herein were applied to the circuit to obtain the results as shown in FIGURE 3*b*. In particular, a Class A push-pull amplifier circuit constructed in accordance with the invention utilized the following components:

| | |
|---|---|
| Tubes **10** and **18** | Type 6BK7 dual triodes. |
| Battery supply **36** | 300 volts. |
| $Z_L$ **32** | 600 ohms. |
| Resistor **28** | 270 ohms. |
| Resistor **42** ($R_3$) | 200 ohms. |
| Resistor **26** | 470 ohms. |
| Resistor **40** ($R_1$) | 270,000 ohms. |
| Resistor **44** ($R_2$) | 2.4 megohms. |
| Capacitor **30** | 4 microfarads, 6 volts. |
| Capacitor **34** | 4 microfarads, 200 volts. |
| Capacitor **46** | .02 microfarad. |

It is understood that the invention is not limited to a class A amplifier or to the above values, which are given by way of example. It is also noted that the amplifying devices described herein for the purpose of example need not be limited to triodes, but other vacuum tubes, or transistors, or any amplifying devices which can operate in single-ended push-pull arrangement may be employed.

There has been described herein a single-ended push-pull amplifier circuit having a negative feedback loop for reducing harmonic distortion, and having a positive feedback loop for enhancing the gain of the circuit without additional amplifiers. The positive feedback loop comprises a feedback resistor coupled between the output load and an amplifying device for sampling the load current and feeding a portion of the sampled current to such device. If the load impedance varies, the conductivity of the device in the positive feedback loop is varied accordingly to maintain the necessary balanced condition for the push-pull amplifier circuit.

What is claimed is:

1. A single ended push-pull amplifier comprising: a first tube having at least a first anode, cathode and control grid; a second tube having at least a second anode, cathode and control grid, said cathodes each having a bias resistor coupled thereto, said first anode being coupled to said second cathode bias resistor; means for applying an input signal to said first control grid, said input signal applying means being coupled to a point of reference potential; means for applying an output signal from said first anode to the second control grid; means for applying a direct current voltage to said second anode; a feedback resistor coupled at one end to the end of the said first cathode bias resistor remote from the cathode and at the other end between said input signal applying means and the point of reference potential; a utilization means connected between said one end of said feedback resistor and the second cathode; and a negative feedback loop connected at one end between said utilization means and said second cathode and at the other end between said first grid and said input signal applying means.

2. A single ended push-pull amplifier comprising: a first amplifying device having a first output electrode, common electrode and input electrode; a second amplifying device having a second output electrode, common electrode and input electrode, said common electrodes each having a bias resistor coupled thereto, said first common electrode bias resistor being shunted by a bypass capacitor, said first output electrode being coupled to said second common electrode bias resistor; means for applying an input signal to said first input electrode, said input signal applying means being coupled to a point of reference potential; means for applying the output signal from said first amplifying device to the second input electrode; means for applying a direct current voltage to said second output electrode; a feedback resistor coupled at one end to the end of said first common electrode bias resistor remote from the cathode and at the other end between said input signal applying means and the point of reference potential; a utilization means connected between said one end of said feedback resistor and the second common electrode; and a negative feedback loop connected at one end between said utilization means and said second common electrode and at the other end between said first grid and said input signal applying means.

3. A single ended push-pull amplifier comprising: first and second amplifier tubes each having a cathode, an anode, and a control grid, and a cathode resistor in the cathode circuit, the anode of the first tube being coupled to the grid of the second tube and to the cathode of the second tube through its cathode resistor; a means for applying a direct current potential between the anode of the second tube and a point of reference potential; an input circuit one end of which is coupled to the grid of the first tube comprising a means for supplying an input signal, the cathode resistor of the first tube and a feedback resistor being coupled betwen said first such cathode and the other end of the input signal supplying means; an output circuit including a load impedance, a first side of which is coupled to a point between the anode of the first triode and the cathode of the second triode; a negative feedback loop connected from the said first side of the load impedance to the input circuit at a point between the grid of the first triode and the one said end of the means for supplying an input signal; and a positive feedback loop connected from the second side of the load impedance to the input circuit at a point between the cathode resistor of the first triode and the feedback resistor, said feedback resistor and said input signal supplying means being coupled to the point of reference potential, said feedback resistor and cathode resistor associated with said first triode having a total resistance substantially equal to the resistance of the cathode resistor associated with the second triode.

References Cited by the Examiner

UNITED STATES PATENTS

| | | | |
|---|---|---|---|
| 2,488,567 | 11/49 | Stodola | 330—116 |
| 2,558,519 | 6/51 | Hill | 330—116 |
| 2,631,197 | 3/53 | Vilkomerson et al. | 330—73 |

ROY LAKE, *Primary Examiner.*

ELI J SAX, NATHAN KAUFMAN, *Examiners.*